(12) United States Patent
Saito et al.

(10) Patent No.: US 7,661,573 B2
(45) Date of Patent: Feb. 16, 2010

(54) HEATING APPARATUS

(75) Inventors: Osamu Saito, Kawasaki (JP); Tetsuji Ishikawa, Kawasaki (JP); Chie Terauchi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 393 days.

(21) Appl. No.: 11/225,029

(22) Filed: Sep. 14, 2005

(65) Prior Publication Data
US 2006/0273141 A1 Dec. 7, 2006

(30) Foreign Application Priority Data
Jun. 7, 2005 (JP) ............................. 2005-167579

(51) Int. Cl.
*B23K 1/00* (2006.01)
(52) U.S. Cl. .......................... 228/19; 228/20.1; 228/51; 228/234.1
(58) Field of Classification Search ................. 228/191, 228/234.1, 264
See application file for complete search history.

(56) References Cited
U.S. PATENT DOCUMENTS 4,971,554 A * 11/1990 Moore .......................... 432/19
5,054,681 A * 10/1991 Kim ............................ 228/191
6,179,196 B1 * 1/2001 Heim et al. ................... 228/6.1
6,897,410 B1 * 5/2005 Ho et al. ...................... 219/385
2002/0084307 A1 * 7/2002 Ruszowski .................... 228/51

FOREIGN PATENT DOCUMENTS

| JP | 5-109838 | 4/1993 |
| JP | 9-260834 | 10/1997 |
| JP | 2000-31217 | 1/2000 |
| JP | 2004-6453 | 1/2004 |

* cited by examiner

*Primary Examiner*—Jessica L. Ward
*Assistant Examiner*—Devang Patel
(74) *Attorney, Agent, or Firm*—Kratz, Quintos & Hanson, LLP

(57) ABSTRACT

The heating apparatus allows an outlet of a heating nozzle to get opposed to an electronic component during detachment of the electronic component from a printed wiring board. Hot air blown out of the outlet of the heating nozzle is utilized to heat the electronic component. Electrically-conductive terminals thus melt between the electronic component and the printed wiring board. An air discharge nozzle is located in the vicinity of the heating nozzle. The air discharge nozzle serve to generate airflow at a location distanced from the heating nozzle. The airflow serves to suppress rise in the temperature in the vicinity of the electronic component. Other electronic component in the vicinity of the electronic component is reliably prevented from rise in temperature. The other electronic component is thus prevented from destruction.

2 Claims, 5 Drawing Sheets

US 7,661,573 B2

HEATING APPARATUS

BACKGROUND OF THE INVENTION

1. Field of the Invention

The present invention relates to a heating apparatus often utilized for attachment and detachment of an electronic component such as an IC (Integrated Circuit) chip to and from the surface of a printed wiring board.

2. Description of the Prior Art

A heating apparatus is often utilized for detachment of a defective IC chip from a printed wiring board in an IC package as disclosed in Japanese Patent Application Publication 2004-006453, for example. The heating apparatus includes a heating nozzle. The outlet of the heating nozzle is opposed to an IC chip. The heating nozzle is designed to blow hot air from the outlet to the IC chip. The hot air allows electrically-conductive terminals or bumps to melt in a space between the IC chip and the printed wiring board. The IC chip is then detached from the printed wiring board.

Other electronic components are usually mounted around the IC chip on the printed wiring board. When the heating nozzle blows hot air to the IC chip, those other electronic components are inevitably exposed to the hot air. If the electronic components are exposed to the hot air beyond the permissible number of times, those other electronic components are destroyed. In particular, the electrically-conductive terminals made of a solder material excluding Pb have a higher melting point. The IC chip is accordingly exposed to a higher temperature. Those other electronic components suffer from a higher probability of destruction.

SUMMARY OF THE INVENTION

It is accordingly an object of the present invention to provide a heating apparatus capable of heating an electronic component without a rise in temperature in a space around the electronic component.

According to a first aspect of the present invention, there is provided a heating apparatus comprising: a heating nozzle defining an outlet designed to blow out hot air; and an air discharge nozzle located off the heating nozzle, said air discharge nozzle designed to generate airflow at a position distanced from the heating nozzle.

The heating apparatus allows the outlet of the heating nozzle to get opposed to an electronic component during detachment of the electronic component from a printed wiring board. Hot air blown out of the outlet of the heating nozzle is utilized to heat the electronic component. Electrically-conductive terminals thus melt between the electronic component and the printed wiring board. On the other hand, an air discharge nozzle is located in the vicinity of the heating nozzle. The air discharge nozzle serves to generate airflow at a location distanced from the heating nozzle. The airflow serves to suppress rise in the temperature in the vicinity of the electronic component. Other electronic component in the vicinity of the electronic component is reliably prevented from rise in temperature. The other electronic component is thus prevented from destruction.

Other electronic component in the vicinity of the electronic component inevitably suffer from a rise in temperature during the heating of the electronic component in a conventional heating apparatus. The other electronic component is necessarily located at a location far distanced from the electronic component that is subjected to heat for detachment. On the other hand, the heating apparatus according to the first aspect enables suppression of rise in the temperature of the other electronic component in the vicinity of the electronic component subjected to heat for detachment. The electronic component can thus be located at a position closer to the electronic component. The electronic components can thus be arranged at a higher density on the printed wiring board.

The air discharge nozzle may include an outlet opened in the opposite direction from the heating nozzle. Air discharged from the outlet of the air discharge nozzle surely serves to generate airflow in the direction getting remoter from the heating nozzle. The air is thus prevented from flowing toward the heating nozzle from the outlet of the air discharge nozzle. The electronic component is accordingly prevented from cooling by the airflow from the air discharge nozzle. The electronic component is allowed to efficiently enjoy a rise in temperature based on the hot air from the heating nozzle.

The heating apparatus of the type may further comprise: an auxiliary heating nozzle defining an outlet opposed to the outlet of the heating nozzle; and an auxiliary air discharge nozzle located off the auxiliary heating nozzle, said air discharge nozzle designed to generate airflow at a position distanced from the auxiliary heating nozzle.

The heating apparatus of the type allows disposition of a printed wiring board in a space between the heating nozzle and the auxiliary heating nozzle. The auxiliary heating nozzle is opposed to the back surface of the printed wiring board, for example. The back surface of the printed wiring board is exposed to hot air from the auxiliary heating nozzle. An electronic component on the front surface of the printed wiring board is allowed to enjoy an efficient rise in the temperature. On the other hand, the auxiliary air discharge nozzles are located around the auxiliary heating nozzle. The auxiliary air discharge nozzles are designed to generate airflow at locations distanced from the auxiliary heating nozzle. The airflow serves to suppress rise in the temperature around the auxiliary heating nozzle at the back surface of the printed wiring board. Other electronic component on the back surface of the printed wiring board is thus reliably prevented from rise in temperature.

According to a second aspect of the present invention, there is provided a heating apparatus comprising: a heating nozzle defining an outlet at the tip end of the heating nozzle, said outlet blowing out hot air; a rectifier plate located around the heating nozzle; and an elastic insulating member continuous to the rectifier plate, said elastic insulating member located at a position adjacent to the tip end of the heating nozzle.

The heating apparatus of the type allows disposition of the rectifier plate around the heating nozzle. The elastic insulting member is set continuous with the rectifier plate. The elastic insulating member is thus also located around the tip end of the heating nozzle. The elastic insulating member is allowed to tightly contact on the surface of a printed wiring board based on elasticity. The elastic insulating member thus serves to block the path of hot air blowing out of the heating nozzle. The hot air is forced to flow along the rectifier plate. The hot air is thus prevented from leakage along the surface of the printed wiring board into a space surrounding the heating nozzle, for example. Temperature is prevented from rise in the vicinity of the electronic component.

The elastic insulating member may bend toward the heating nozzle based on elastic deformation in the heating apparatus of the type. The elastic insulating member thus serves to define a path of the hot air along the elastic insulating member and the rectifier plate from the tip end of the heating nozzle based on the elastic deformation. The hot air blowing out of the outlet of the heating nozzle is efficiently led to the rectifier plate along the elastic insulating member. The hot air is reliably prevented from leakage along the surface of the printed wiring board into a space surrounding the heating nozzle, for example.

The heating apparatus of the type may further comprise: an auxiliary heating nozzle defining an outlet at the tip end of the auxiliary heating nozzle, said outlet opposed to the outlet of the heating nozzle; an auxiliary rectifier plate located around the auxiliary heating nozzle; and an auxiliary elastic insulating member continuous to the rectifier plate, said auxiliary elastic insulating member located at a position adjacent to the tip end of the auxiliary heating nozzle.

The heating apparatus of the type allows the back surface of the printed wiring board to receive hot air from the auxiliary heating nozzle. An electronic component on the front surface of the printed wiring board is allowed to enjoy an efficient rise in the temperature. On the other hand, the auxiliary rectifier plate is located around the auxiliary heating nozzle. The auxiliary elastic insulating member is set continuous to the auxiliary rectifier plate. The auxiliary elastic insulating member serves to prevent the hot air from leaking out along the back surface of the printed wiring board into a space surrounding the auxiliary heating nozzle, for example. Other electronic component on the back surface of the printed wiring board is reliably prevented from rise in temperature.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
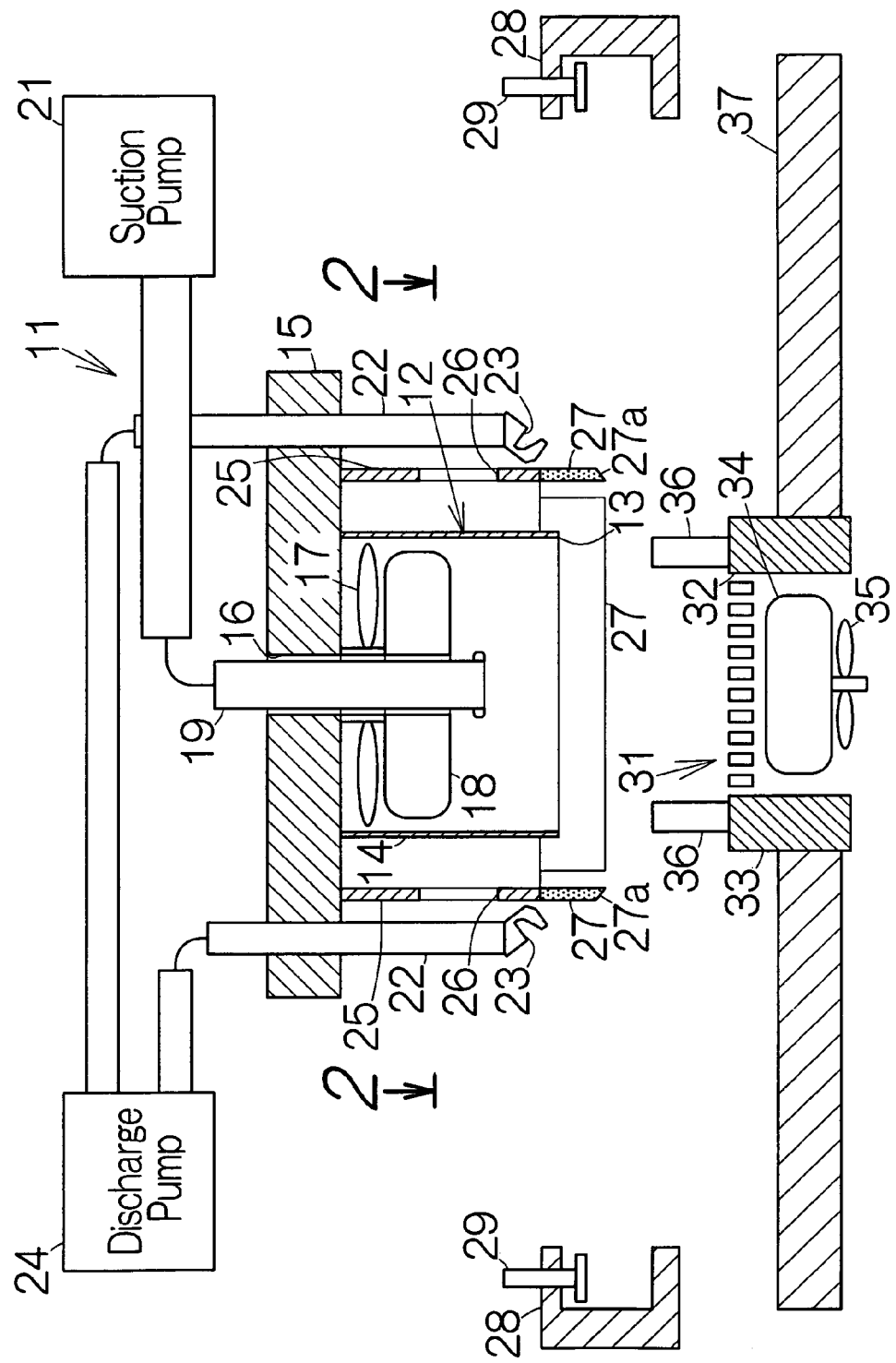
FIG. 1 is a sectional view schematically illustrating the structure of a heating apparatus according to a first embodiment of the present invention.

FIG. 1 schematically illustrates the structure of a heating apparatus 11 according to a first embodiment of the present invention. The heating apparatus 11 includes a heating nozzle 12. The heating nozzle 12 includes a trunk or shell 14. The shell 14 defines a hexahedral inside space opened at a quadrilateral outlet 13 at the tip or lower end, for example. The shell 14 is fixed to a movable member 15. A support tube 16 is fixed to the movable member 15 inside the shell 14. The longitudinal axis of the support tube 16 is directed toward the outlet 13. The movable member 15 is allowed to move along the longitudinal axis of the support tube 16.

A blower fan 17 is set within the support tube 16 for relative rotation. The blower fan 17 generates airflow along the longitudinal axis of the support tube 16. The generated airflow is discharged from the outlet 13. A heater 18 is located in a space between the blower fan 17 and the outlet 13. The heater 18 may include a nickel/chrome/iron alloy wire as a heating element. The heater 18 serves to heat airflow from the blower fan 17. The hot air is in this manner blown out of the outlet 13.

A suction nozzle 19 is located inside the shell 14 of the heating nozzle 12. The suction nozzle 19 may be located in a space inside the support tube 16. The suction nozzle 19 is designed to penetrate through the support tube 16 and the movable member 15. The tip end of the suction nozzle 19 is allowed to reach the outlet 13. The suction nozzle 19 is designed to suck air from the tip end. A suction pump 21 is connected to the suction nozzle 19. The suction nozzle 19 is allowed to move along the longitudinal axis of the support tube 16 independent of the movable member 15.

Air discharge nozzles 22, 22, . . . , four of them in this case, are located around the heating nozzle 12. The air discharge nozzles 22 are fixed to the movable member 15. An outlet 23 is formed at the tip end of the individual air discharge nozzle 22. The outlet 23 is opened in the opposite direction from the heating nozzle 12. The air discharge nozzles 22 are allowed to generate airflow at positions distanced from the heating nozzle 22. A discharge pump 24 is connected to the air discharge nozzles 22, 22, . . . . A governor, not shown, may be connected to the discharge pump 24. The governor serves to control the pressure of the air discharged from the outlets 23.

Rectifier plates 25, 25, . . . , four of them in this case, are located around the heating nozzle 12, for example. The rectifier plates 25 are fixed to the movable member 15. The rectifier plates 25 are set opposed to the outer surface of the heating nozzle 12. The rectifier plate 25 is located in a space between the heating nozzle 12 and each of the air discharge nozzles 22. An opening 26 is defined in the rectifier plate 25. The opening 26 is located closer to the movable member 15 rather than the outlet 13 of the heating nozzle 12 and the outlets 22 of the air discharge nozzles 23.

An elastic insulating member 27 is attached to each of the rectifier plates 25. The elastic insulating member 27 is continuous with the corresponding rectifier plate 25. A heat proof adhesive may be employed to fix the elastic insulating member 27 to the corresponding tip or lower end of the rectifier plate 25. The elastic insulating members 27 are thus located around the outlet 13 at the tip end of the heating nozzle 12. An inclined surface 27a is formed at the lower end of the elastic insulating member 27. The inclined surface 27a gets closer to the heating nozzle 12 at a location remoter from the movable member 15. The elastic insulating member 27 may be made of an expanded silicone, for example. Electrically-conductive metallic particles may be dispersed in the expanded silicone.

The heating apparatus 11 further includes holding members 28, 28, . . . , four of them in this case, for example. The holding members 28 are designed to hold an electronic component package. A screw 29 is mounted on the individual holding member 28 for relative movement in parallel with the longitudinal axis of the support tube 16. The printed wiring board of the electronic component package is held between the screw 29 and the corresponding holding member 28. The holding members 28 are capable of moving along an imaginary plane perpendicular to the longitudinal axis of the support tube 16.

The heating apparatus 11 further includes an auxiliary heating nozzle 31. The auxiliary heating nozzle 31 includes a trunk or shell 33 defining a quadrilateral outlet 32 at the tip or upper end. The outlet 32 is opposed to the outlet 13 of the heating nozzle 12. A heater 34 is located inside the shell 33. The heater 34 may be made of a nickel/chrome/iron alloy wire, for example. A blower fan 35 is coupled with the heater 34 for relative rotation around an imaginary axis aligned with the longitudinal axis of the support tube 16. The blower fan 35 generates airflow along the imaginary axis. Hot air is thus blown out of the outlet 32. Supporting columns 36, 36, . . . , four of them in this case, are located at the upper edge of the shell 33.

An auxiliary heater 37 is coupled with the shell 33 of the auxiliary heating nozzle 31. The auxiliary heater 37 extends along an imaginary plane perpendicular to the imaginary axis of the auxiliary heating nozzle 31. The size of the auxiliary heater 37 may depend on the extent of the printed wiring board 42, for example. Here, the auxiliary heater 37 may have an extent completely covering over the printed wiring board 42, for example. The auxiliary heater 37 may be made of a heating element such as a nickel/chrome/iron alloy wire. The auxiliary heating nozzle 31 and auxiliary heater 37 are allowed to move along the imaginary axis aligned with the longitudinal axis of the support tube 16.

Figure 2:
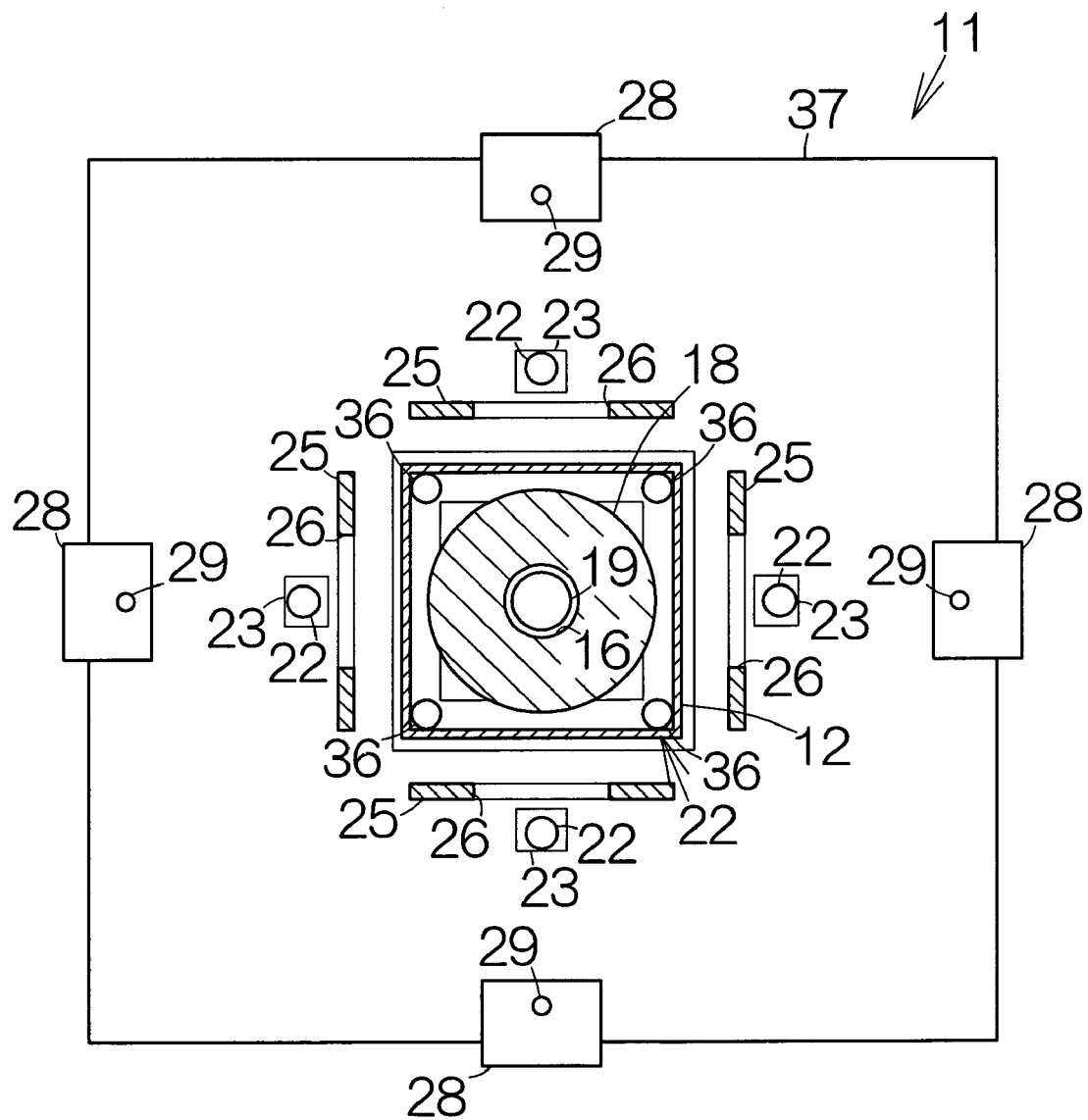
FIG. 2 is a plan view schematically illustrating the structure of the heating apparatus.

As shown in FIG. 2, the rectifier plates 25 and the elastic insulating members 27 are opposed to the outer flat surfaces of the heating nozzle 12 from a pair of opposite directions. Space may be formed between the adjacent rectifier plates 25 and the adjacent elastic insulating members 27. The air discharge nozzles 22 are correspondingly located outside the rectifier plates 25. Likewise, the holding members 28 are correspondingly located at positions distanced from the individual outer flat surfaces of the heating nozzle 12. The supporting columns 36, 36, . . . are located at the corners of an imaginary quadrilateral defined based on the heating nozzle 12, for example.

Figure 3:
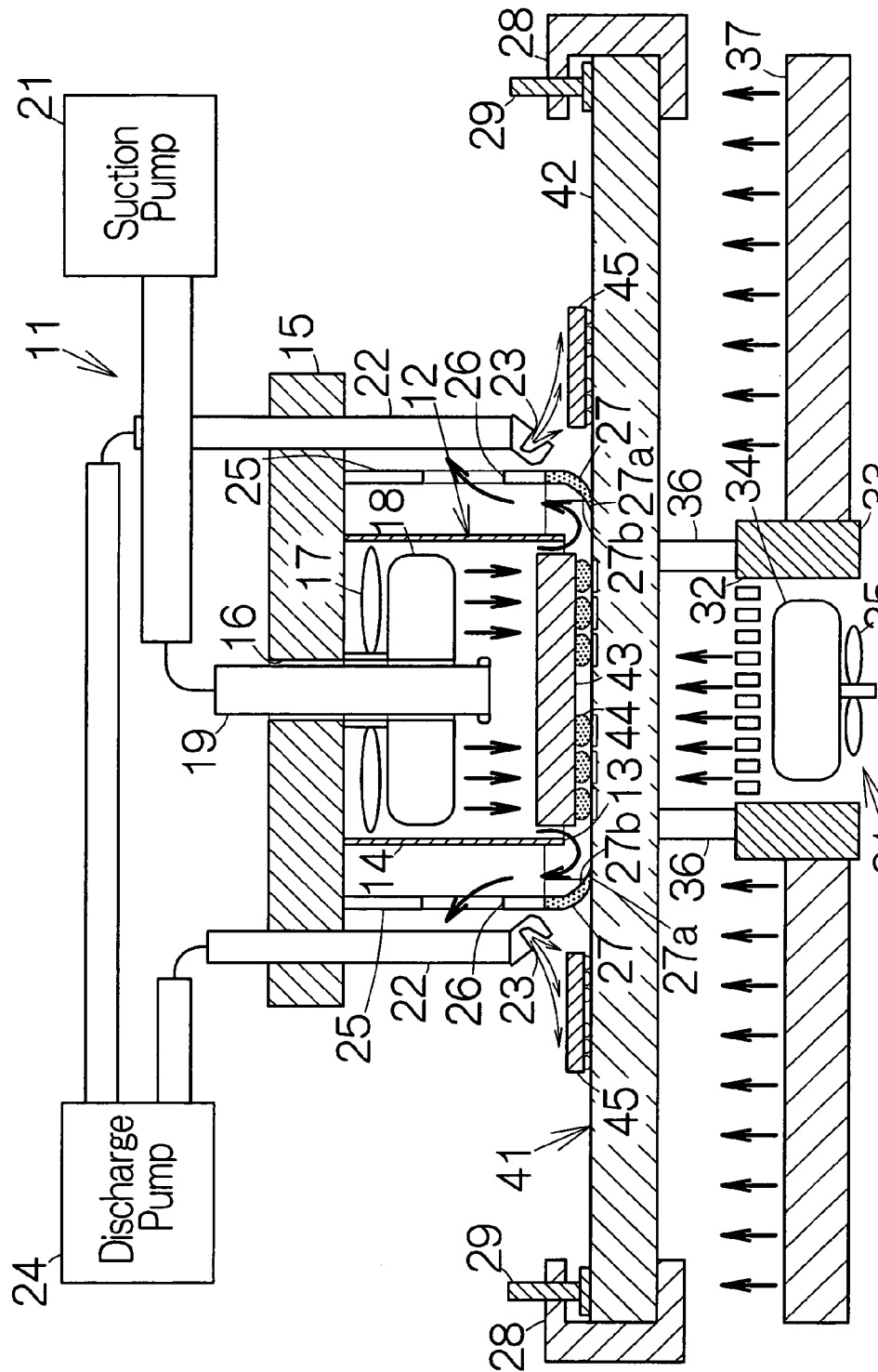
FIG. 3 is a sectional view schematically illustrating the process of detaching an IC chip from a printed wiring board in an electronic component package.

Now, assume that the heating apparatus 11 is utilized to detach an IC chip from a printed wiring board in an electronic component or IC package. As shown in FIG. 3, the printed wiring board 42 of the electronic component package 41 is held on the holding members 28, 28, . . . based on the screws 29. The printed wiring board 42 is in this manner set in a space between the heating nozzle 12 and the auxiliary heating nozzle 31. The holding members 28 are allowed to move along an imaginary plane perpendicular to the longitudinal axis of the support tube 16, so that the IC chip 43 representative of an electronic component mounted on the printed wiring board 42 is aligned with the heating nozzle 12 and auxiliary heating nozzle 31 along the imaginary plane. Images captured by an image capturing apparatus may be utilized for the alignment of the IC chip 43, for example.

The movable member 15 moves downward to the upper surface of the printed wiring board 42 along the longitudinal axis of the support tube 16. The IC chip 43 is received inside the shell 14 of the heating nozzle 12. The elastic insulating members 27 contact the upper surface of the printed wiring board 42 at the inclined surfaces 27a. The inclined surfaces 27a serve to cause elastic deformation of the elastic insulating members 27 toward the heating nozzle 12 during a further downward movement of the movable member 15. Inclined surfaces 27b are in this manner established on the elastic insulating members 27. The inclined surfaces 27b are opposed to the outlet 13. The inclined surfaces 27b get distanced from the upper surface of the printed wiring board 42 at a location remoter from the heating nozzle 12.

The auxiliary heating nozzle 31 and the auxiliary heater 37 are simultaneously lifted up toward the back surface of the printed wiring board 42. The printed wiring board 42 is thus received on the upper ends of the supporting columns 36, 36, . . . , Here, a space may be set between the adjacent supporting columns 36 based on the dimension of the sides of the IC chip 43, for example. The supporting columns 36, 36, . . . serve to prevent the printed wiring board 42 from flexure in response to a rise in temperature.

The heating nozzle 12 and the auxiliary heating nozzle 31 are then turned on. The heaters 18, 34 generating heat. The blower fans 17, 35 cause hot air to flow into the outlets 13, 32. The hot air is blown to the IC chip 43 and the back surface of the printed wiring board 42. The hot air causes rise in temperature of the electrically-conductive terminals 44 and the printed wiring board 42. When the temperature of the electrically-conductive terminals 44 has risen beyond the melting point, the electrically-conductive terminals 44 start melting. Here, the electrically-conductive terminals 44 form a ball grid array.

The hot air blown out of the outlet 13 flows away from the IC chip 43 along the upper surface of the printed wiring board 42. The hot air then runs toward the inclined surfaces 27b of the elastic insulating members 27. Since the inclined surfaces 27b get remoter from the upper surface of the printed wiring board 42 at a location remoter from the heating nozzle 12, the hot air is guided along the inclined surfaces 27b toward the movable member 15 in a space between the shell 14 of the heating nozzle 12 and the rectifier plates 25. The hot air is then discharged outward from the openings 26 of the rectifier plates 25. A circulation path is in this manner established for the hot air. The heating nozzle 12 enables an efficient temperature rise in the inside space of the shell 14.

The auxiliary heater 37 is also turned on. The auxiliary heater 37 generates heat. The generated heat is radiated toward the back surface of the printed wiring board 42 except for the section receiving the IC chip 43. The printed wiring board 42 is thus uniformly heated. A difference in temperature is suppressed between the section receiving the IC chip 43 and the section surrounding the IC chip 43. A reduced difference in the temperature leads to a uniform thermal expansion in the printed wiring board 42. The printed wiring board 42 is reliably prevented from deformation.

The discharge pump 24 in parallel supplies warm air to the air discharge nozzles 22, 22, . . . . Since the outlets 23 of the air discharge nozzles 22 are opened in the opposite direction from the heating nozzle 12, the warm air from the outlets 23 flows outward toward the outer periphery of the printed wiring board 42 along the upper surface of the printed wiring board 42. The warm air serves to suppress a rise in the temperature of the electronic components 45 mounted around the IC chip 43. The temperature of the warm air may be set lower than the heatproof temperature of the IC chip 43 by 30 to 50 degrees Celsius approximately, for example.

When the electrically-conductive terminals 44 melt, the suction nozzle 19 moves downward toward the upper surface of the IC chip 43 along the longitudinal axis of the support tube 16. The suction pump 21 then starts sucking air. When the tip or lower end of the suction nozzle 19 reaches the upper surface of the IC chip 43, the IC chip 43 sticks to the lower end of the suction pump 19 based on the suction of the suction pump 21. The suction nozzle 19 is thereafter lifted upward in the direction getting distanced from the upper surface of the printed wiring board 42 along the longitudinal axis of the support tube 16. The melted electrically-conductive terminals 44 are thus separated from the upper surface of the printed wiring board 42. The IC chip 43 is in this manner detached from the upper surface of the printed wiring board 42.

Next, assume that the IC chip 43 is mounted on the upper surface of the printed wiring board 42. The printed wiring board 42 is held on the holding members 28. The IC chip 43 is held at the lower end of the suction nozzle 19 based on the suction of the suction pump 21. The electrically-conductive terminals 44 are in advance formed on the back surface of the IC chip 43. The heating nozzle 12 and the auxiliary heating nozzle 31 are positioned at predetermined positions relative to the printed wiring board 42. While the heating nozzle 12 moves downward toward the upper surface of the printed wiring board 42, the auxiliary heating nozzle 31 moves upward toward the back surface of the printed wiring board 42.

The suction nozzle 19 then moves downward toward the upper surface of the printed wiring board 42. The electrically-conductive terminals 44 are received on the upper surface of the printed wiring board 42. As described above, the IC chip 43 is heated based on the action of the heating nozzle 12 and the auxiliary heating nozzle 31. When the temperature of the electrically-conductive terminals 44 has risen beyond the melting point, the electrically-conductive terminals 44 melt. The suction pump 21 subsequently stops sucking air. The IC chip 43 is thus released from the suction nozzle 19. The application of heat is then stopped. The electrically-conductive terminals 44 get cured or hardened based on cooling. The electrically-conductive terminals 44 are thus allowed to attach to the printed wiring board 42.

The heating apparatus 11 utilizes hot air blown out of the heating nozzle 12 so as to heat the IC chip 43. The electrically-conductive terminals 44 melt in response to the application of heat. The electronic components 45 located around the IC, chip 43 are prevented from rise in temperature based on the warm air discharged from the air discharge nozzles 22. While the IC chip 43 is exposed to a high temperature, the electronic components 45 are prevented from rise in temperature in the vicinity of the IC chip 43. The temperature of the electronic components 45 is reliably kept below the heatproof temperatures of the electronic components 45. The electronic components 45 is thus prevented from destruction.

The electronic components 45 inevitably suffer from exposure to a higher temperature during the heating of the IC chip 43 in a conventional heating apparatus. It is thus impossible to avoid a rise in temperature of the electronic components 45. Accordingly, the electronic components 45 are necessarily located at locations far distanced from the IC chip 43. On the other hand, the heating apparatus 11 according to the present invention enables suppression of rise in the temperature of the electronic components 45. The electronic components 45 can thus be located at positions closer to the IC chip 43. The IC chip 43 and the electronic components 45 can thus be arranged at a higher density on the printed wiring board 42.

In addition, the outlets 23 of the air discharge nozzles 22 are opened in the opposite direction from the heating nozzle 12. The outlets 23 serves to generate airflow at positions distanced from the heating nozzle 12. Specifically, the airflow flows outward toward the outer periphery of the printed wiring board 42. The airflow from the outlets 23 is thus prevented from flowing toward the heating nozzle 12. The IC chip 43 is prevented from cooling by the airflow from the outlets 23. The IC chip 43 is allowed to efficiently enjoy a rise in the temperature.

Furthermore, the elastic insulating members 27 are set continuous with the corresponding rectifier plates 25. The elastic insulating members 27 are allowed to tightly contact on the upper surface of the printed wiring board 42 based on elastic deformation without a gap. The elastic insulating members 27 serve to reliably block off the path of the hot air. In addition, the elastic insulating members 27 bend toward the heating nozzle 12. The hot air thus flows upward along the rectifier plates 25, for example. The electronic components 45 are thus reliably prevented from exposure to the hot air. This results in suppression of a rise in the temperature of the electronic components 45. Moreover, the electrically-conductive metallic particles dispersed in the elastic insulating members 27 enables avoidance of electrification of the printed wiring board 42 from the heating nozzle 12 and the movable member 15.

Figure 4:
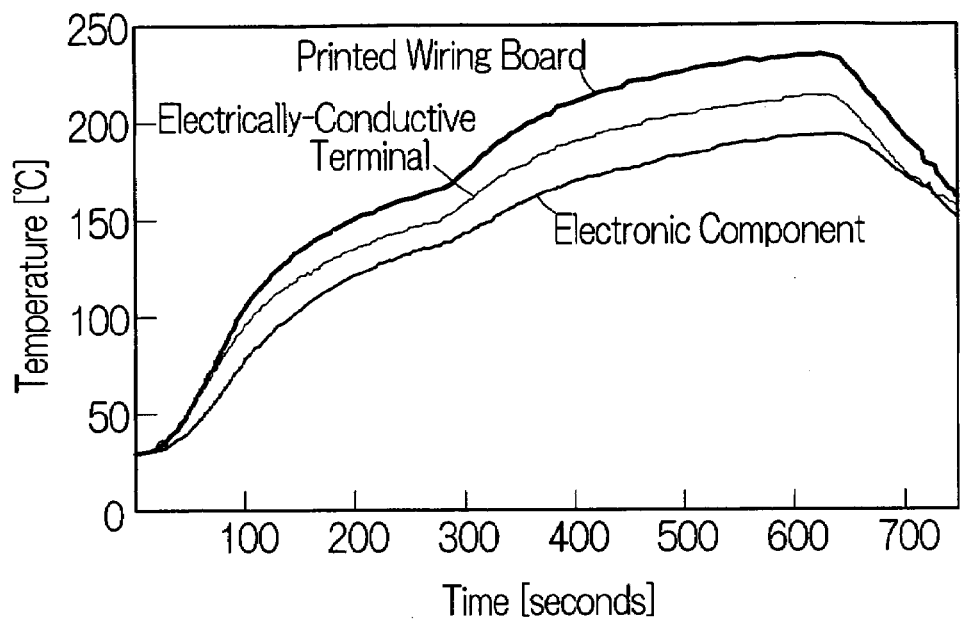
FIG. 4 is a graph showing the change in the temperature of the electronic component package subjected to heat based on a conventional heating apparatus according to a comparative example.

The inventors have observed the effect of the heating apparatus 11. The inventors prepared a specific example of the present invention and a comparative example. A heating apparatus of the comparative example included none of the air discharge nozzles 22, the rectifier plates 25 and the elastic insulating member 27. The electrically-conductive terminals 44 of the electronic component package 41 were made of a solder material of Sn/Ag/Cu. The electrically-conductive terminals 44 were arranged within an area of 45 mm square on the back surface of the IC chip 43. The electronic components 45 were distanced from the IC chip 43 by 10 mm. The temperature of the IC chip 43, the electrically-conductive terminals 44 and the electronic components 45 was respectively measured during detachment of the IC chip 43. The peak appeared in the temperature of the electronic components 45 at 193 degrees Celsius in the heating apparatus of the comparative example, as shown in FIG. 4.

Figure 5:
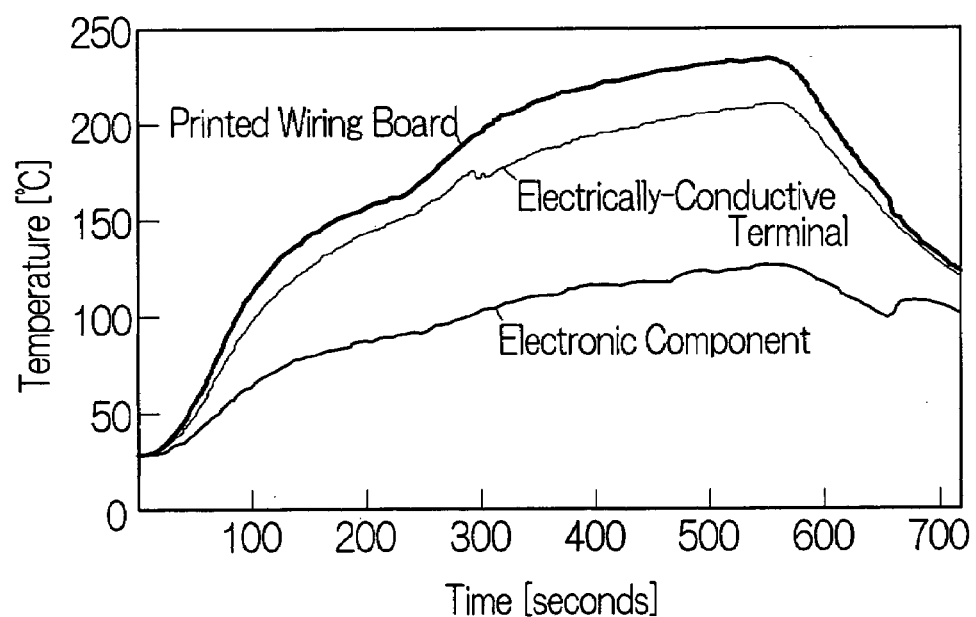
FIG. 5 is a graph showing the change in the temperature of the electronic component package subjected to heat based on the heating apparatus according to a specific example of the present invention.

The temperature of the air from the air discharge nozzles 22 was set at 25 degrees Celsius in the heating apparatus 11 of the invention. The air was supplied at the flow rate of 200 [liter/min]. The pressure of the air was set at 0.23 [MPa]. As shown in FIG. 5, the peak appeared in the temperature of the electronic components 45 at 126 degrees Celsius. It has been confirmed that the rectifier plates 25, the elastic insulating members 27 and the air discharge nozzles 22 in combination serve to significantly suppress rise in the temperature of the electronic components 45 as compared with the heating apparatus of the comparative example.

Figure 6:
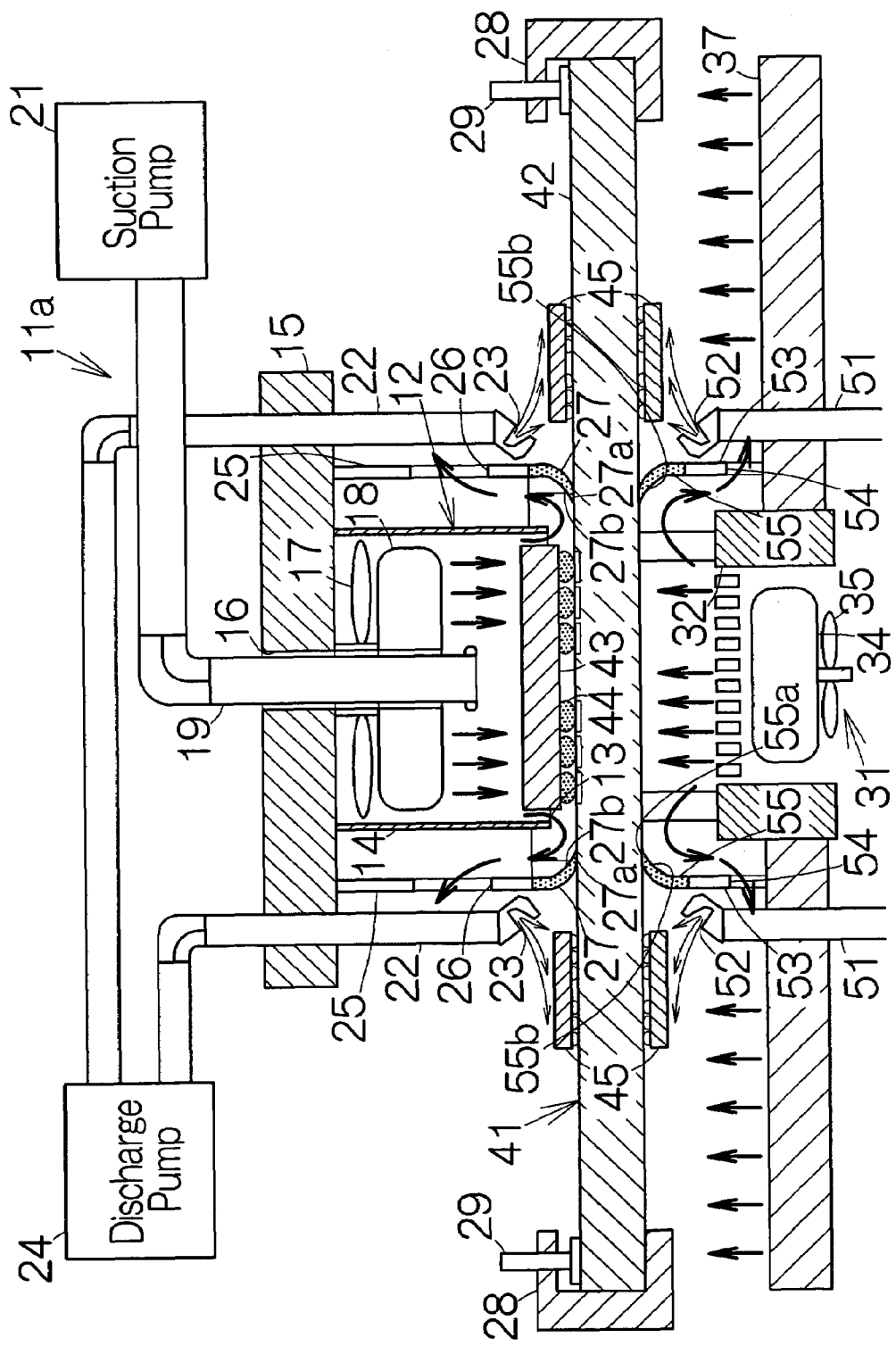
FIG. 6 is a sectional view schematically illustrating the structure of a heating apparatus according to a second embodiment of the present invention.

FIG. 6 schematically illustrates a heating apparatus 11a according to a second embodiment of the present invention. The heating apparatus 11a includes auxiliary air discharge nozzles 51 located around the auxiliary heating nozzle 31. The auxiliary air discharge nozzles 51 are fixed to the auxiliary heater 37, for example. An outlet 52 is defined at the tip end of the individual auxiliary air discharge nozzle 51. The outlet 52 is opened in the opposite direction from the auxiliary heating nozzle 31. The aforementioned discharge pump 24 may be connected to the auxiliary air discharge nozzles 51. The auxiliary air discharge nozzles 51 enable generation of airflow at positions distanced from the auxiliary heating nozzle 31.

The heating apparatus 11a further includes auxiliary rectifier plates 53 located around the auxiliary heating nozzle 31. The auxiliary rectifier plates 53 may be fixed to the auxiliary heater 37, for example. The individual rectifier plate 53 is located in a space between the auxiliary heating nozzle 31 and the corresponding auxiliary air discharge nozzle 51. An opening 54 is defined in the individual auxiliary rectifier plate 53. The opening 54 may be located closer to the auxiliary heater 37 than the outlet 52 of the auxiliary air discharge nozzle 51 is.

An auxiliary elastic insulating member 55 is attached to each of the auxiliary rectifier plates 53. The auxiliary elastic insulating member 55 is continuous with the corresponding auxiliary rectifier plate 53. The auxiliary elastic insulating members 55 are located around the outlet 32 at the tip or upper end of the auxiliary heating nozzle 31. The tip ends of the auxiliary elastic insulating members 55 are located at positions farther from the auxiliary heater 37 beyond the outlet 32 of the auxiliary heating nozzle 12. An inclined surface 55a is formed at the tip end of the auxiliary elastic insulating member 55. The auxiliary elastic insulating members 55 is allowed to elastically deform so as to get closer to the auxiliary heating nozzle 31. The auxiliary elastic insulating member 55 may have structure identical to that of the aforementioned elastic insulating member 27. Like reference numerals are attached to structure or components equivalent to those of the aforementioned first embodiment.

The heating apparatus 11a of the type allows suppression of rise in the temperature of the electronic components 45 based on air discharged from the auxiliary air discharge nozzles 51, even if the electronic components 45, for example, are mounted on the back surface of the printed wiring board 42. While the IC chip 43 is exposed to a high temperature, the electronic components 45 are prevented from rise in temperature. Not only the electronic components 45 on the upper or front surface of the printed wiring board 42 but also the electronic components 45 on the back surface of the printed wiring board 42 are thus prevented from destruction.

In addition, the auxiliary elastic insulating members 55 are allowed to tightly contact on the back surface of the printed wiring board 42 based on elastic deformation. The auxiliary elastic insulating members 55 serve to reliably block off the path of the hot air from the auxiliary heating nozzle 31. The auxiliary elastic insulating members 55 bend inward toward the auxiliary heating nozzle 31 based on elastic deformation. The hot air is thus forced to flow along the auxiliary elastic insulating members 55 to the auxiliary rectifier plates 53. The hot air is released through the openings 54. The electronic components 45 on the back surface of the printed wiring board 42 are thus reliably prevented from exposure to the hot air.

What is claimed is:

1. A heating apparatus comprising:
   a heating nozzle including a trunk defining an outlet designed to blow out hot air, the trunk being expected to contain an electronic component on a printed wiring board;
   an air discharge nozzle located off the heating nozzle, said air discharge nozzle designed to generate airflow to cool outside the trunk;
   a rectifier plate located between the trunk and the air discharge nozzle to separate the airflow from the hot air; and
   an elastic insulating member attached to a lower end of the rectifier plate, the elastic insulating member being configured to deform to bend in a space between the trunk and the air discharge nozzle in response to contact of the elastic insulating member against the printed wiring board.

2. The heating apparatus according to claim 1, further comprising:
   an auxiliary heating nozzle defining an outlet opposed to the outlet of the heating nozzle; and
   an auxiliary air discharge nozzle located off the auxiliary heating nozzle, said air discharge nozzle designed to generate airflow at a position distanced from the auxiliary heating nozzle.

* * * * *